Figure 1:
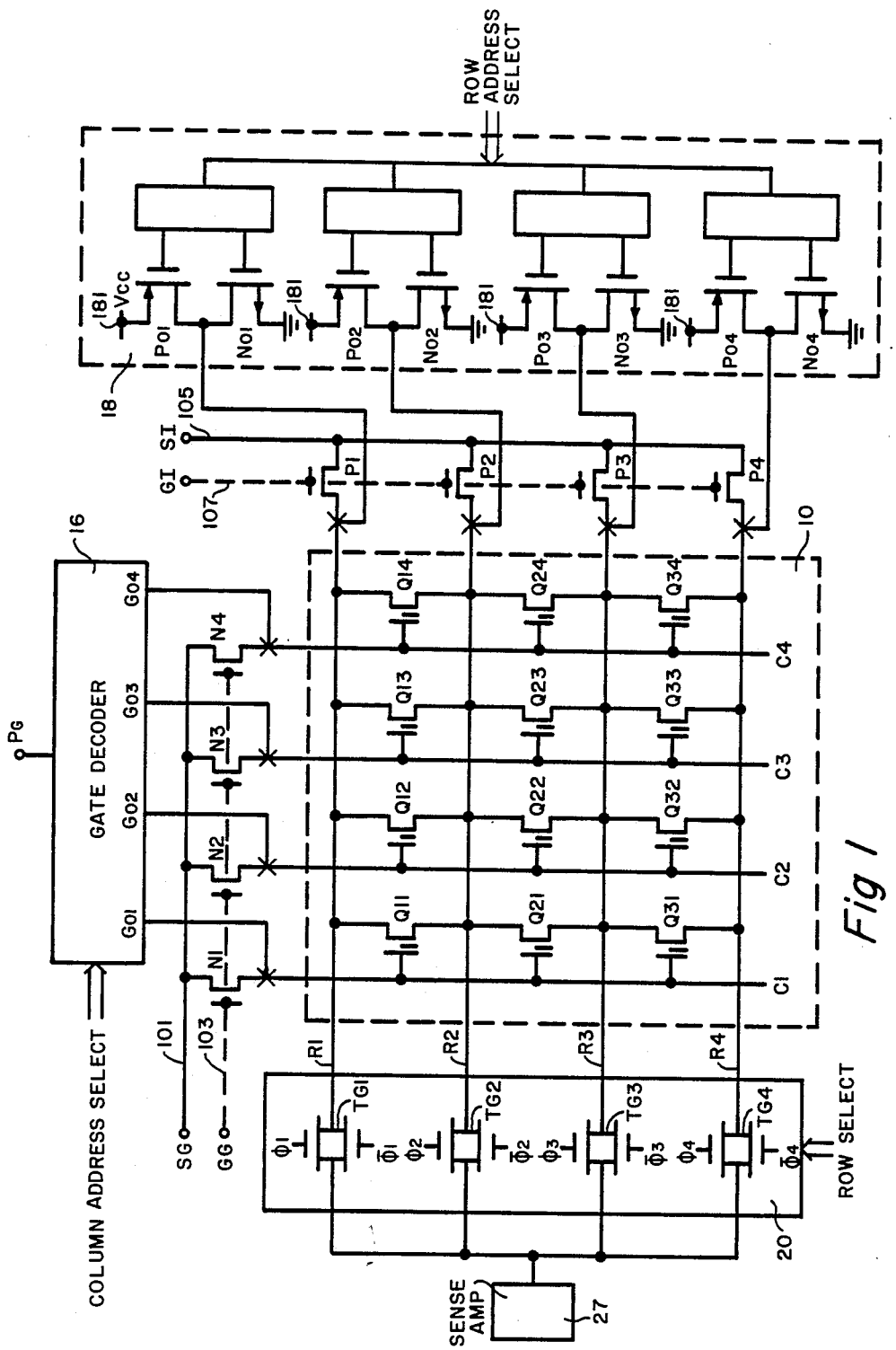

United States Patent [19]

Hsu

[11] Patent Number: 4,727,515
[45] Date of Patent: Feb. 23, 1988

[54] HIGH DENSITY PROGRAMMABLE MEMORY ARRAY

[75] Inventor: Sheng T. Hsu, West Windsor Township, Mercer County, N.J.

[73] Assignee: General Electric Co., Schenectady, N.Y.

[21] Appl. No.: 561,220

[22] Filed: Dec. 14, 1983

[51] Int. Cl.[4] ............................................. G11C 11/40
[52] U.S. Cl. .................................... 365/185; 365/203; 365/230
[58] Field of Search ................ 365/51, 182, 184, 185, 365/203, 189, 230

[56] References Cited

U.S. PATENT DOCUMENTS

| | | | |
|---|---|---|---|
| 4,282,446 | 8/1981 | McElroy | 365/185 |
| 4,417,328 | 11/1983 | Ochii | 365/203 |
| 4,434,478 | 2/1984 | Cook et al. | 365/185 |
| 4,451,905 | 5/1984 | Moyer | 365/185 |

Primary Examiner—James W. Moffitt
Attorney, Agent, or Firm—Henry I. Steckler; Allen LeRoy Limberg

[57] ABSTRACT

An array of electrically alterable floating gate devices arranged in rows and columns with each column of devices sharing a column conductor. Each row of devices is connected between two row conductors with adjacent rows sharing a common row conductor whereby in an array having N rows of devices there is a total of (N+1) row conductors. Input and output decoders connected to the row conductors enable the unique read-out of any selected element.

9 Claims, 10 Drawing Figures

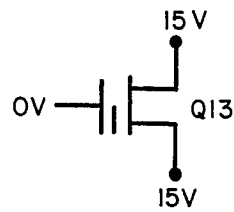
Fig. 3D
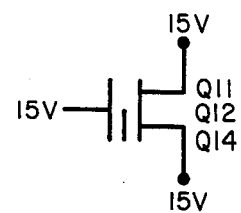
Fig. 3F
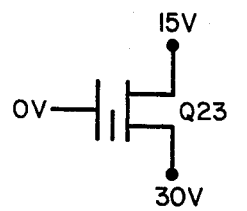
WRITE "1" ___ V_{TH} __
Fig. 3A
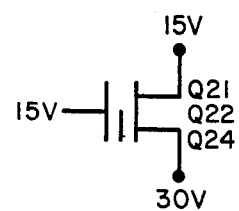
Fig. 3B
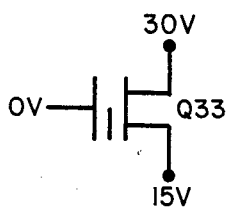
Fig. 3C
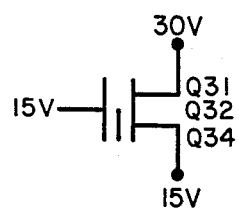
Fig. 3E
Fig. 3

HIGH DENSITY PROGRAMMABLE MEMORY ARRAY

This invention relates to high density semiconductor memory arrays.

A significant effort in the design of large scale integrated circuit semiconductor memories is directed toward increasing their density and thereby their capacity. An approach to increasing the density of a memory array includes the reduction in the number of row (and/or column) conductors by having adjacent rows (or columns) of memory cells share the row (or column) conductors necessary to write information into, or read information from, the cells of the array. However, sharing row (or column) conductors gives rise to several problems which are aggravated where the cells sharing a common column (row) conductor also share a common row (column) conductor.

For example, to write information into a selected cell certain stress potentials have to be applied between the row and column conductors associated with that cell. Non-selected cells sharing a column and a row conductor with the stressed (selected) cell also undergo severe stress. A problem then arises of writing information into a selected cell without disturbing (or erroneously writing) the information stored in non-selected cells of the memory array sharing a row(and/or a column) conductor with a selected cell. Reading or sensing the information stored in a particular cell also becomes problematic where a selected cell shares a row and a column conductor with a non-selected cell. The problem lies in sensing the information stored in the selected cell and not comprising that information with the information stored in non-selected cells.

The problems of writing and sensing discussed above are resolved in circuits embodying the invention.

Circuits embodying the invention include a plurality of electrically alterable floating gate devices arranged in rows and columns, each one of these devices having a control electrode and source and drain electrodes defining the ends of a conduction path. Each column of devices has a column conductor connected to the control electrodes of the device of that column. Each row of devices is connected between two row conductors with adjacent rows sharing a common row conductor, whereby in an array having N rows of devices there are (N+1) row conductors. With the exception of the first and last rows, the drain electrodes of the devices of one row and the source electrodes of the devices of the adjacent row are connected to a common row conductor. Connecting the drain electrodes of the devices of one row to the source electrodes of an adjacent row enables the writing of information into the devices of one row without disturbing or erroneously writing information into the devices of an adjacent row. The information stored in the devices may be uniquely sensed by means of decoding circuitry connected to the rows.

Figure 2B:
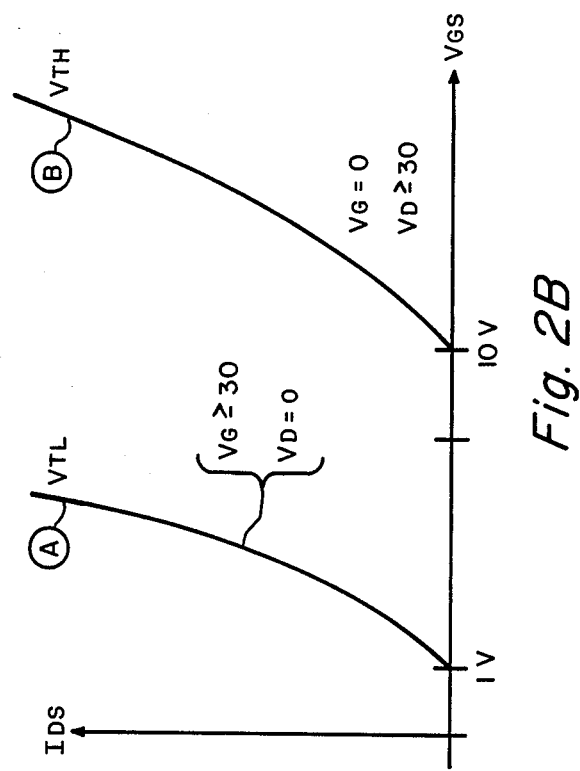
Figure 2A:
Figure 2C:

In the accompanying drawing, like reference characters denote like components; and FIG. 1 is a partial schematic, partial block, diagram showing a memory array embodying the invention;

FIGS. 2A, 2B and 2C are, respectively, the schematic representation of a gate-injected metal-oxide semiconductor (GIMOS) transistor which may be used to practice the invention, the current voltage characteristics of the GIMOS transistor for two different values of threshold voltage ($V_{TL}$ and $V_{TH}$), and the schematic representation of a GIMOS transistor set to the low threshold voltage ($V_{TL}$) condition; and FIGS. 3A, 3B, 3C, 3D, 3E and 3F represent various stress conditions applied to the transistors of the array during a write cycle.

The circuit of FIG. 1 includes a matrix array 10 of memory elements Qij arranged, for purpose of example, in 3 rows and 4 columns, where the postscript "i" designates the order of the row and the postscript "j" designates the order of the column.

The storage or memory elements Qij used to form array 10 are Gate-Injected Metal-Oxide Semiconductor (GIMOS) field-effect transistors. These devices are known and are described, for example, in U.S. Pat. No. 4,297,719 entitled ELECTRICALLY PROGRAMMABLE CONTROL GATE INJECTED FLOATING GATE SOLID STATE MEMORY TRANSISTOR AND METHOD OF MAKING SAME and U.S. Pat. No. 4,332,077 entitled METHOD OF MAKING ELECTRICALLY PROGRAMMABLE CONTROL GATE INJECTED FLOATING GATE SOLID STATE MEMORY TRANSISTOR both assigned to the assignee of this present application, and the subject matter of which is incorporated herein by reference.

For ease of the description to follow, the symbol for a GIMOS is shown in FIG. 2A. The GIMOS has a floating gate which is offset towards the drain. The GIMOS has a control electrode (control gate) and source and drain electrodes defining the ends of its conduction path within a substrate. The GIMOS transistors used in the circuit of FIG. 1 are of N-conductivity type and the current-voltage ($I_{DS}$ vs. $V_{GS}$) characteristic of the N-type GIMOS for two different values of threshold voltage is shown in FIG. 2B. When a voltage (e.g. +30 volts) is applied to the control gate electrode of the GIMOS which is more positive than the drain voltage (e.g. 0 volts) by some minimum voltage (which in this application is assumed to be 20 volts) holes are injected from the control gate onto the floating gate reducing the gate voltage necessary to turn on the N-channel device. The GIMOS is then set to its low threshold voltage ($V_{TL}$) condition - Curve A in FIG. 2B. In this application, $V_{TL}$ is assumed equal to 1 volt at low values of drain-source current, and elements set to $V_{TL}$ are identified with a dot as shown in FIG. 2C.

When a voltage (e.g. 0 volts) is applied to the gate electrode of the GIMOS which is more negative than the drain voltage (e.g. 30 volts) by more than some minimum value (i.e. 20 volts) electrons are injected from the control gate onto the floating gate increasing the gate voltage necessary to turn it on. The GIMOS is then set to its high treshold voltage ($V_{TH}$) condition, shown in Curve B of FIG. 2B. In this application, $V_{TH}$ is assumed equal to 10 volts at low values of drain-source current. It is further assumed that a voltage applied between the gate and drain, regardless of polarity, which is less than 20 volts will have no effect on the condition of the GIMOS.

The GIMOS is a non-volatile device capable of sustaining tens of thousands of write/erase (W/E) cycles. The digital information stored in a GIMOS can be read out at least $10^{12}$ times without any change in threshold voltage. Therefore, a GIMOS is an ideal device for use in electrically alterable memory applications such as electrically Erasable Programmable Read-Only Memory (EEPROM). Although GIMOS devices are used in this application, other types of floating gate devices and non-volatile memory elements could be used instead.

Referring back to FIG. 1, note that the conduction paths of the elements Qij of a row i are connected between a row conductor Ri and a row conductor R(i+1) and that the gate electrodes of the elements Qij of a column are connected to a corresponding Cj column conductor. Furthermore, the source electrodes of elements Qij are connected to row conductor Ri and their drain electrodes are connected to row conductor R(i+1). Hence, adjacent rows of elements, except for the first and last, share a common row conductor.

Each column conductor Cj is connected via the source drain path of an N-conductivity type enhancement insulated-gate field-effect transistor [IGFET], Nj, to a line 101 to which is applied a signal SG. The gate electrodes of the Nj transistors are connected to a terminal 103 to which is applied a signal GG. A gate decoder 16 having one output (G0j) per column is connected to the column conductors Cj. Decoder 16, in response to column address inputs applies an enabling potential (i.e. a high signal) to selected column conductor(s).

Each row conductor is coupled via the conduction path of an IGFET of P-conductivity type (e.g. transistor Pi) to a line 105 to which is applied a signal SI. The gate electrodes of the Pi transistors are connected in common to a line 107 to which is applied a signal GI. The row conductors are connected at one end to an input decoder 18 and at the other end to an output decoder 20. Gate decoder 16 and input decoder 18 are of the type which can selectively supply +30 volts, +15 volts, +5 volts or zero volts at any one of their outputs. Circuitry capable of performing this function is well known and hence is not detailed. Output decoder 20 includes transmission gates which when enabled provide a low impedance path and when disabled provide a very high impedance path between the row conductors and the input to a sense amplifier 27. The roles of the input and output decoders are further detailed below. However, it is assumed that the input, output and gate decoders have tri-state outputs. As used herein the tri-state output capability means that the decoders can selectively produce at their outputs any one of the following:

1. a clamp to a positive voltage to produce a "high" or logic "1" level; —The "high" level may be +30 volts, +15 volts, or +5 volts depending on the operating voltage.

2. a clamp to a negative or low voltage to produce a "low" or logic "0" level; —The "low" level may be typically zero volts; or 3. a high output impedance level, which permits the potential at the output of the decoder to float.

The operation of the memory array will now be described assuming that all the elements of the array are initially set to their "zero" or low threshold state ($V_{TL}$) (i.e. erased).

In order to set all the elements of the memory array to their $V_{TL}$ condition, decoders 16, 18 and 20 are set to their tri-state condition (i.e. condition 3 above) and the following voltages are applied to the various row and column conductors. A voltage of 30 volts is applied to lines 101 and 103 and thereby to the gates of the Nj transistors. This has the effect of turning-on all the Nj transistors and applying 30 volts to the column conductors (Cj) of array 10. Concurrently, a voltage of zero volts is applied to lines 105 and 107. This has the effect of turning-on all the Pi transistors causing all the row conductors to be driven to zero volts. Consequently, each Qij element of array 10 has a voltage of +30 volts applied to its gate electrode and zero volts applied to its drain and source electrodes. With 30 volts applied to their gates and zero volts to their drains, holes are injected into and stored in and on the floating gate of all the Qij elements. So biased, each Qij element is set to its low threshold voltage ($V_{TL}$) condition defined herein as the "zero" state, or as the "erase" condition. After setting the elements Qij to $V_{TL}$ the GG and GI signals are set to a condition to turn-off the Nj and Pi transistors.

It will now be shown that a selected element can be set (written) to the high threshold—$V_{TH}$—(logic "1") condition and that the non-selected elements of the array will not be disturbed. To write a selected device (Qij) to the $V_{TH}$ state (i.e. logic "1"), gate decoder 16 is programmed to apply zero volts to the column conductor (Cj) of the selected device and a voltage of $V_{DD}$ volts, which is assumed to be 15 volts, to the other column conductors in the array. Concurrently, input decoder 18 is programmed to apply $V_{EE}$ volts, which is assumed to be 30 volts, to the row conductor R(i+1) connected to the drain electrode (i.e. the electrode closest to the floating gate) of a selected element Qij and 15 volts to all the other row conductors of the array. During this portion of the write cycle, output decoder 20 is disabled; that is, all the transmission gates in the decoder are turned-off.

Assume, for example, that element Q23 is to be set to $V_{TH}$. This is accomplished by programming decoder 18 to apply 30 volts to row conductor R3 which is connected to the drain of Q23, and 15 volts to row conductor R2, connected to the source of Q23, and to the other row conductors. Concurrently, gate decoder 16 is programmed to apply 0 volts to column conductor C3 which is connected to the gate electrode of Q23, and +15 volts to the remaining column conductors of the array. As shown in FIG. 3A, this bias condition sets elements Q23 to the $V_{TH}$ condition.

It remains to be shown that the elements sharing a row and/or a column with Q23 remain set to their previous state (i.e. are not disturbed) while Q23 is set to $V_{TH}$. As shown in FIG. 3B, elements Q21, Q22 and Q24, which share the same row conductors as Q23, will have 30 volts applied to their drain and 15 volts applied to their source and gate electrodes. For this bias condition elements Q21, Q22 and Q24 are only half-stressed, that is, the voltage differential between their gate and drain electrodes is only 15 volts (i.e. less than 20 volts). Hence these devices will remain in the state to which they were formerly set.

Element Q33 which shares the same column conductor (C3) and a row conductor (R3) with Q23 is also not disturbed. As shown in FIG. 3C, element Q33 has 15 volts applied to its drain, zero volts applied to its gate and 30 volts applied to its source electrode. Q33 is stressed with 30 volts between its source and gate, but this is insufficient to alter the state of Q33, since the stress between its gate and drain is only 15 volts. Hence connecting the source electrodes of the elements (e.g. Q33) of one row to the drain electrodes of the elements (e.g. Q23) of the adjacent row enables one row to be written without disturbing the adjacent row.

Element Q13 which shares column conductor C3 and row conductor R2 with Q23 has 15 volts applied to its source and drain elements and zero volts applied to its gate electrode as shown in FIG. 3D. Q13 thus has a maximum stress of 15 volts applied between its gate and drain electrodes and remains undisturbed in the state to which it was previously set.

Elements Q31, Q32 and Q34, which share row conductor R3 with Q23 but which are not in the same column as Q23, have 15 volts applied to their gate and drain electrodes and 30 volts applied to their source electrodes, as shown in FIG. 3E. Since their gates and drains are at the same potential, there is no stress between their gate and drain electrodes and only a 15 volt stress between their gate and source electrodes. Hence, these elements remain in whatever state they were in prior to Q23 being set to $V_{TH}$.

Elements Q11, Q12 and Q14 which share row conductor R2 with Q23 have 15 volts applied to their gate, source and drain electrodes, as shown in FIG. 3F. These elements are obviously not stressed and will remain in their previous state.

Hence, it has been shown that for the arrangement shown in FIG. 1, a selected element can be written from the $V_{TL}$ to the $V_{TH}$ state and the information contained in the remaining elements of the array will not be disturbed. Thus any bit (device) can be selected and written to a desired ($V_{TL}$ or $V_{TH}$) state.

It remains to be shown that each device, whether set to $V_{TL}$ (i.e. storing a logic "0") or set to $V_{TH}$ (i.e. storing a logic "1") can be read out reliably and without disturbing the contents of any other cells of the array.

The unique read out of the contents of array 10 is achieved with the aid of input decoder 18 and output decoder 20.

As shown in FIG. 1, each row conductor is connected at one end to an output of input decoder 18 and at its other end to an input of output decoder 20. Each output of decoder 18 includes a tri-state output stage comprised of a P-type IGFET (POi) having its source-to-drain path connected between its respective row conductors (Ri) and a power terminal 181 to which may be applied a potential of $V_{CC}$ volts, during read and a potential of $V_{DD}$ or $V_{EE}$ during write. Each tri-state output also includes an N-type IGFET (N0i) having its source-to-drain path connected between its corresponding row conductor (Ri) and ground. In response to row address commands each tri-state output may be set during the read cycle to one of the following conditions:

1. The POi transistor may be turned-on to clamp its associated row conductor Ri to $V_{CC}$ volts while the corresponding N0i transistor is turned-off.

2. The N0i transistor may be turned-on clamping its associated row conductor Ri to ground while the POi transistor is turned-off.

3. The POi and N0i transistors may both be turned-off whereby the output impedance is very high.

4. A POi transistor may be momentarily turned-on to charge its associated row conductor Ri to $V_{CC}$. The POi transistor may then be turned-off and Ri remains charged or precharged to $V_{CC}$ volts until discharged.

Decoder 18 may be any one of a number of known circuits which in response to a set of commands (row address select) drives selected ones of its outputs and the corresponding row conductor to the desired conditions described above.

Output decoder 20 includes a complementary transistor transmission gate (TGi) connected between each row conductor Ri and the input to a sense amplifier 27. During a normal read cycle only one of the transmission gates is turned on at any one time. That is, at any one time only one of the transmission gates provides a low impedance conduction path between its corresponding row conductor and the input to sense amplifier 27. The output decoder is shown as complementary transistor transmission gates which can be selectively enabled by means of control signals Qi and $\overline{Q}i$. However, it should be evident that many other logic gate arrangements could be used to perform the same or similar function.

The read out of a particular element Qij is achieved as follows:

1. Gate decoder 16 is programmed to apply a voltage $V_{CC}$ of, for example, +5 volts, to the column conductor Cj connected to the control gate of the element Qij to be read, and a voltage of zero volts to all the other column conductors of the array. It is assumed that no element with zero volts applied to its control electrode can conduct. Therefore, the only elements of array 10 that can conduct are those elements whose control electrodes are connected to column conductor Cj to which +5 volts is applied.

2. Input decoder 18 is programmed to clamp the row conductor (i.e. Ri) connected to the source electrode of the device Qij being read to zero volts. This is accomplished, for example, by the turn-on of transistor NOi in the output stage of decoder 18.

3. Input decoder 18 is programmed to precharge all the other row conductors of array 10 to a potential of $V_{CC}$ volts (i.e. +5 volts). Precharging of the row conductors is accomplished by momentarily turning-on the PO transistors in the output stages of decoder 18. Following the turn-off of the PO transistors all the row conductors except for row conductor Ri remain charged to $V_{CC}$ volts.

4. Output decoder 20 is programmed to enable the transmission gate [TG(i+1)] connected to the row conductor R(i+1) and in turn to the drain of element Qij which is to be read out. TG(i+1) is the only transmission gate in decoder 20 which is turned on. All the other transmission gates in decoder 20 connecting a row conductor to a sense amplifier 27 are turned off.

It can now be shown that the state of any element Qij may be uniquely read out. Assume, for example, that element Q23 is to be read out. As noted above, C3 is then driven to +5 volts, and row conductor R2 is clamped to zero volts via N02 while all the other row conductors are precharged to +5 volts. If Q23 is set to $V_{TH}$, Q23 does not conduct with +5 volts on C3, since $V_{TH}$ is assumed to be 10 volts. That is, the +5 volts applied to its gate electrode and the zero volts applied to its source electrode produces a gate-to-source potential of 5 volts which is insufficient to turn-on Q23. Since Q23 does not conduct, row conductor R3, which was precharged to +5 volts, remains charged at +5 volts. The +5 volts level on row conductor R3 is then coupled via enabled transmission gate TG3 to the input of a sense amplifier 27 which further amplifies the signal.

Other elements in the same column as Q23 and sharing the same column conductor (i.e. C3) as Q23 may be turned-on if set to $V_{TL}$. However their turn-on does not affect the read-out of element Q23. For example, assume that element Q13 is set to $V_{TL}$, which is assumed to be 1 volt. Element Q13 will then discharge row conductor R1, via its conduction path, to ground potential to which row conductor R2 is clamped. However, since Q23 does not conduct and since the source electrode of Q23 is already at ground, the conduction of Q13 does not affect the voltage at the drain of Q23 and hence the read out of Q23. Furthermore, since the transmission gate TG1 is turned off, the discharge of row conductor R1 to ground cannot and does not affect the read-out of the array. Any element [e.g. Q33]connected to the drain circuit of Q23 also does not affect the read-out of Q23, when the latter is turned-off. For example, if Q33 is set to $V_{TL}$, it conducts when C3 is at +5 volts. However, the effect of the conduction of Q33 is to reinforce the precharge level of 5 volts present on conductor R3. Hence the +5 volts on row conductor R3 is not affected. Thus, it can be concluded that the $V_{TH}$ condition of Q23 is uniquely and reliably read out.

If Q23 is set to $V_{TL}$, Q23 conducts when +5 volt is applied to C3 and row conductor R2 is grounded. Q23 then discharges row conductor R3 to, or close to, ground via its source-to-drain path. The "low" condition produced on row conductor R3 is then coupled via transmission gate TG3 to sense amplifier 27 which further amplifies and conditions the output signal.

The conduction or non-conduction of non-selected elements (e.g. Q13) in a row connected to the source electrode (e.g. R2) of the selected element (e.g. Q23) being read-out does not affect the read-out of the selected element since its source electrode is grounded and remains clamped at that potential. Non-selected elements [e.g. Q33]connected to the drain electrode of the selected element have no effect on its read-out if the non-selected elements are set to $V_{TH}$ (i.e. do not conduct).

Non-selected elements [e.g. Q33]connected to the same row conductor (i.e. R3) as the drain electrode of the selected element may have a transient effect on the read-out of the selected element when the non-selected element and the selected element are set to $V_{TL}$. However as demonstrated below, the effect is not significant. For example, if element Q33 and other elements (e.g., Q43, Q53—not shown), whose conduction paths are connected in series with Q33, are set to $V_{TL}$, they provide a conduction path in series with Q23 to discharge their various row conductors to ground. Regardless of the number of devices in series with the drain of Q23, row conductor R3 is eventually discharged to ground since the row conductors are precharged to +5 volts and not clamped to +5 volts. However, some time is required to establish this steady state condition. To optimize the speed of response of the system, the geometries of the memory devices as well as the ON impedance of the N0i transistors and the sense amplifier are tailored to provide a fast response. Thus the condition of a selected transistor (e.g. Qij) whether set to $V_{TL}$ or $V_{TH}$ can be uniquely and reliably sensed and read out.

The tri-state output stage of input decoder 18 has been shown to be of the complementary transistor transmission gate type. This is a very efficient and low power consumption type arrangement. However, it should be evident that other known circuits capable of performing the same or similar function could be used instead.

In the discussion above and in the claims appended hereto it should be evident that the terms rows and columns may be used interchangeably. That is, the rows could be interchanged for the columns and the columns for the rows.

What is claimed is:

1. The combination comprising:
   a plurality of electrically alterable floating gate devices arranged in N rows and M columns, each one of said devices having a control electrode and source and drain electrodes defining the ends of a conduction path, each one of said devices being of the type which assumes a first threshold voltage condition ($V_{T1}$) when its gate is made positive with respect to its drain by more than a given voltage ($V_G$) and which assumes a second threshold voltage condition ($V_{T2}$) when its gate is made negative with respect to its drain by more than said given voltage; where N and M are integers greater than 2;

M column conductors, one column conductor per column of devices, each column conductor being connected to the control electrodes of the devices of a column;

N+1 row conductors, a pair [Ri and R(i+1)]of row conductors per row of devices, with each intermediate row (Ni) of devices, sharing one (Ri) of its pair of row conductors with a first [N(i−1)]adjacent row of devices positioned on one side of said intermediate row and sharing the other one [R(i+1)]of its pair of row conductors with a second [N(i+1)]adjacent row of devices positioned on the other side of said intermediate row;

means connecting the source electrodes of the devices of each intermediate row.(Ni) and the drain electrodes of the devices of said first [N(i−1)]adjacent row to said one [Ri]of its pair of row conductors; and means connecting the drain electrodes of the devices of each intermediate row and the source electrodes of the devices of said second [N(i+1)]adjacent row to said other one [R(i+1)]of its pairs of row conductors;

an input decoder having one output per row conductor, each output being connected to a different one of said row conductors for selectively supplying write and sense signals to said row conductors;

an output decoder coupled to said row conductors for selectively sensing the signals present on a selected row conductor; and a gate decoder having one output per column conductor, each output being connected to a different one of said column conductors for selectively supplying sense and write signals to said column conductors.

2. The combination as claimed in claim 1 wherein said floating gate devices are gate-injected insulated-gate field-effect transistors.

3. The combination as claimed in claim 1 wherein said input decoder and said column decoder for selectively supplying write signals to said row and column conductors includes means for setting all the elements of the array to one of said $V_{T1}$ and $V_{T2}$ condition and then setting selected elements to the other one of $V_{T1}$ and $V_{T2}$.

4. The combination as claimed in claim 1 wherein each one of said input decoder outputs includes a tri-state output stage, each tri-state output stage for selectively performing one of the following functions:
   a. precharging its associated row conductor to a high level;
   b. clamping its associated row conductor to a low level; or
   c. presenting an extremely high impedance at its output whereby its associated row conductor can assume any potential between the high and low levels.

5. The combination as claimed in claim 4 wherein said output decoder includes transmission gates coupled between said row conductors and a sense amplifier and wherein said output decoder includes means for enabling only one of said transmission gates at any one time whereby only one row conductor is coupled to said sense amplifier at any one time.

6. The combination as claimed in claim 1 wherein said input decoder includes means for selectively applying a read potential across the two conductors betwen which a selected floating gate device is connected; and wherein said output decoder includes means for selectively sensing the signal generated on one of said two row conductors between which a selectd floating gate device is connected.

7. The combination comprising:

a plurality of electrically alterable floating gate devices arranged in rows and columns, each one of said devices having a control electrode, and source and drain electrodes defining the ends of a conduction path, each one of said devices being of the type which assumes a first threshold voltage condition ($V_{T1}$) when its gate is made positive with respect to its drain by more than a given voltage ($V_G$) and which assumes a second threshold voltage condition ($V_{T2}$) when its gate is made negative with respect to its drain by more than said given voltage;

a column conductor per column, each column conductor being connected to the control electrodes of the device of that column;

a single row conductor per pair of adjacent rows, the drain electrodes of the devices of one row of a pair of adjacent rows being connected to said row conductor and the source electrodes of the other pair of the adjacent rows being connected to said row conductor;

a first decoder having one output per row conductor coupled to said row conductors for selectively supplying signals to said row conductors;

a second decoder coupled to each one of said row conductors having an output and including means for selectively coupling a selected one of said row conductors to said output; and a gate decoder having one output per column conductor for selectively supplying read and write signals to selected ones of said column conductors.

8. The combination as claimed in claim 7 wherein one of said $V_{T1}$ and $V_{T2}$ is a low threshold voltage state and the other one of said $V_{T1}$ and $V_{T2}$ is a high threshold voltage state; and wherein said input and gate decoders include means for first setting all the devices of the array to said low threshold voltage state and for then setting selected ones of the devices of the array to said high threshold voltage condition.

9. The combination as claimed in claim 8 wherein said input, output and gate decoders include means for applying a read voltage to the control electrode of a selected device, said read voltage having an amplitude intermediate said high and low threshold voltage state, whereby a device in the low threshold voltage state is rendered conducting, and wherein said output decoder includes means for coupling the row conductor connected to the drain electrode of said selected device to said output of said output decoder.

* * * * *